US006606281B2

(12) United States Patent
Cowgill et al.

(10) Patent No.: US 6,606,281 B2
(45) Date of Patent: Aug. 12, 2003

(54) PERSONAL AUDIO PLAYER WITH A REMOVABLE MULTI-FUNCTION MODULE

(75) Inventors: Clayton N. Cowgill, Vancouver, WA (US); John Marshall, Beaverton, OR (US); Phil Johnson, Portland, OR (US); Michael Walters, Battleground, WA (US)

(73) Assignee: Digital Networks North America, Inc., Santa Clara, CA (US)

( * ) Notice: Subject to any disclaimer, the term of this patent is extended or adjusted under 35 U.S.C. 154(b) by 0 days.

(21) Appl. No.: 09/881,900

(22) Filed: Jun. 14, 2001

(65) Prior Publication Data

US 2002/0015362 A1 Feb. 7, 2002

Related U.S. Application Data

(60) Provisional application No. 60/211,839, filed on Jun. 15, 2000.

(51) Int. Cl.[7] .................................................. H04B 1/20
(52) U.S. Cl. ........................................ 369/11; 369/29.02
(58) Field of Search ................................. 369/11, 12, 10, 369/1, 2, 6, 7, 29.02, 25.01; 704/270, 500; 700/94

(56) References Cited

U.S. PATENT DOCUMENTS

| | | | | |
|---|---|---|---|---|
| 4,074,082 A | * | 2/1978 | Sato et al. ..................... | 369/11 |
| 4,199,724 A | * | 4/1980 | Kondo ......................... | 369/11 |
| 4,303,807 A | * | 12/1981 | Sato ............................. | 369/11 |
| 5,477,511 A | * | 12/1995 | Englehardt .................... | 369/25 |
| 5,511,000 A | | 4/1996 | Kaloi et al. ............... | 364/514 A |
| 5,774,863 A | * | 6/1998 | Okano et al. ................ | 704/278 |
| 5,839,108 A | | 11/1998 | Daberko et al. ............ | 704/270 |
| 5,903,871 A | * | 5/1999 | Terui et al. .................. | 704/500 |
| 6,031,915 A | * | 2/2000 | Okano et al. ................. | 381/56 |
| 6,038,199 A | * | 3/2000 | Pawlowski et al. ........... | 369/25 |
| 6,061,306 A | * | 5/2000 | Buchheim ...................... | 369/2 |
| 6,163,508 A | * | 12/2000 | Kim et al. ..................... | 369/7 |
| 6,301,513 B1 | * | 10/2001 | Divon et al. .................. | 700/94 |
| 6,321,129 B1 | * | 11/2001 | DaAgosto, III .............. | 700/94 |
| 6,327,633 B1 | * | 12/2001 | Chawla et al. ................ | 710/62 |
| 6,342,664 B2 | * | 1/2002 | Sawada et al. ............... | 84/601 |

FOREIGN PATENT DOCUMENTS

DE        199 22 035 A1    11/2000

OTHER PUBLICATIONS

Motion Picture Video Display Device, Alan Amron, US 2001/0043194 A1, pub date: Nov. 22, 2001.*

* cited by examiner

*Primary Examiner*—Tan Dinh
(74) *Attorney, Agent, or Firm*—McDonnell Boehnen Hulbert Berghoff

(57) ABSTRACT

A digital audio player has a removable and interchangeable multi-function module that has at least one operating member. The multi-function interchangeable module interoperates with the body of the digital audio player to provide a plurality of features, which include, but are not limited to, additional memory storage, radio tuner, display, Infrared transceiver and wireless transceiver.

42 Claims, 15 Drawing Sheets

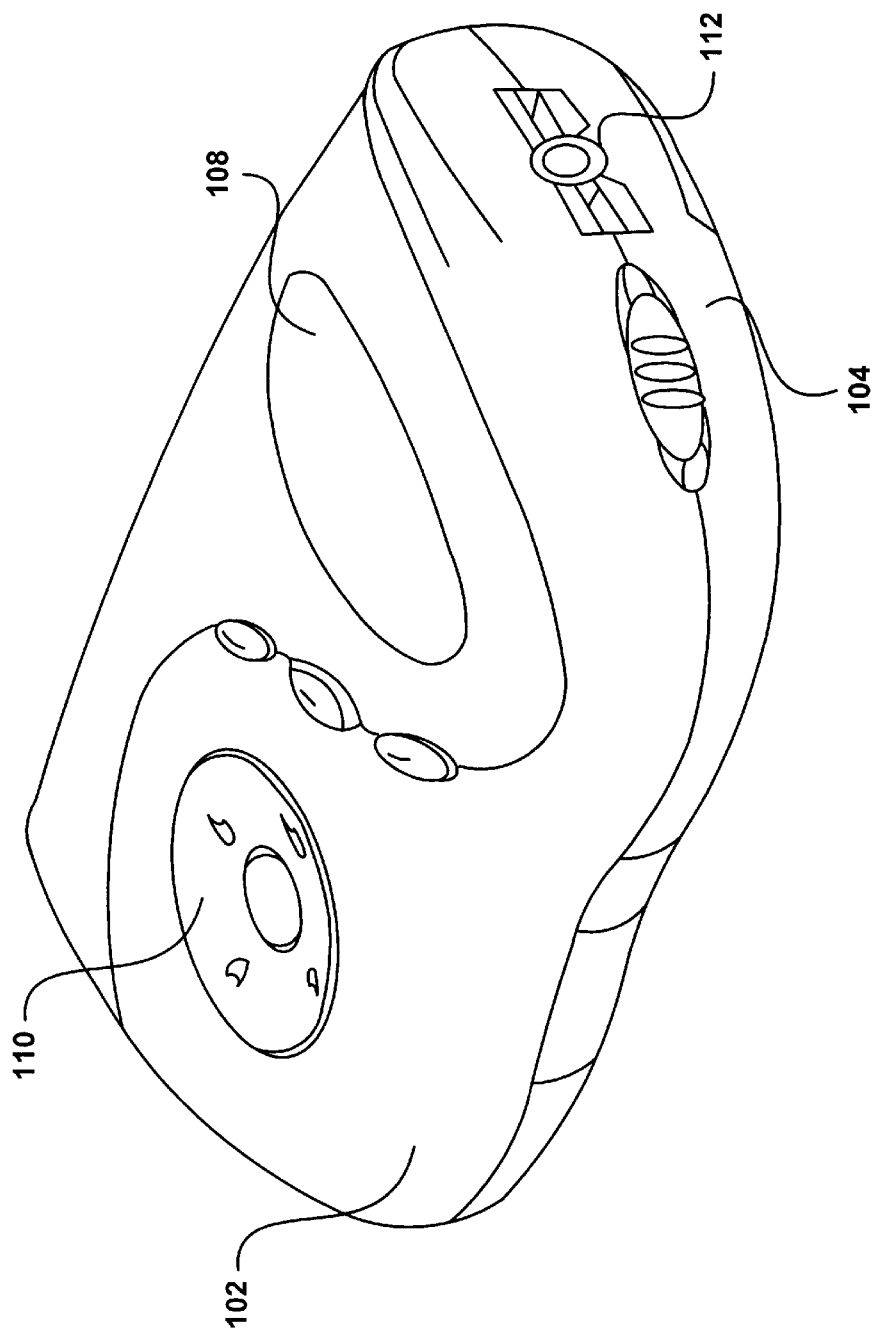

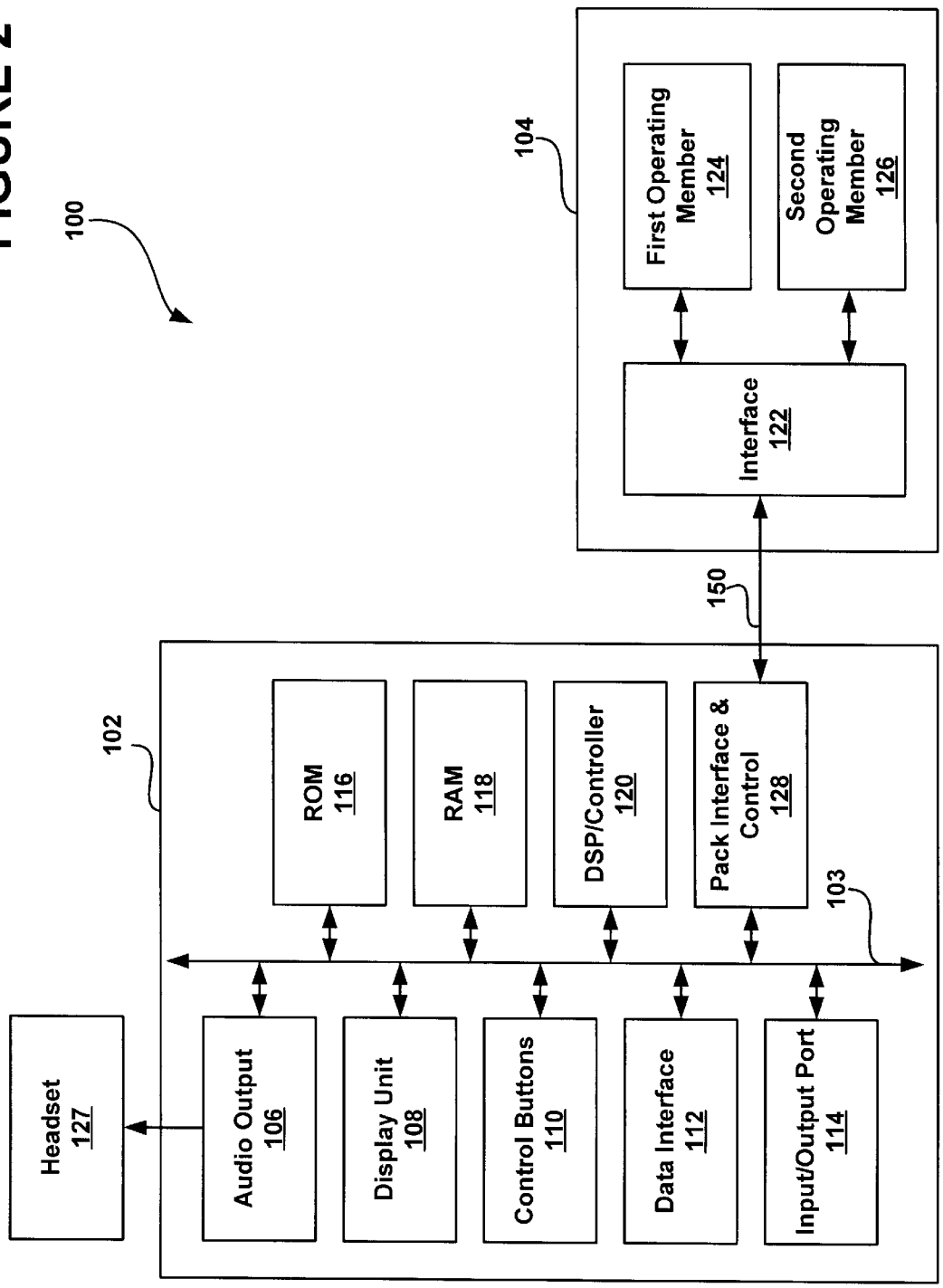

PERSONAL AUDIO PLAYER WITH A REMOVABLE MULTI-FUNCTION MODULE

RELATED APPLICATIONS

This application claims priority to U.S. provisional patent application serial No. 60/211,839, filed on Jun. 15, 2000, entitled "Personal Audio Player with a Removable Multi-function Pack"; U.S. design patent application serial No. 29/125,073, filed on Jun. 15, 2000, entitled "Audio Player Apparatus"; and U.S. design patent application serial No. 29/131,132, filed on Oct. 13, 2000, entitled "Audio Player Apparatus", all of which are incorporated by reference herein in their entirety.

BACKGROUND OF THE INVENTION

1. Field of the Invention

The present invention relates generally to a digital hardware device, in particular, to a digital audio player with a plurality of removable multi-function modules.

2. Description of the Background Art

Because of their compact size and weight combined with high quality audio output, digital audio players have become well known and their use widespread. A digital audio player typically includes a digital signal processor, a memory, a power supply and a headphone. Examples of such a digital audio player are the Rio 600 and Rio 800 manufactured and sold by SONICblue Inc. of Santa Clara, Calif.

The success of portable digital audio players elevates expectation for new breeds of audio players offering more desirable features.

First, consumers need portable digital audio players with functionalities beyond a simple music playback function. For example, a digital audio player may include an FM radio tuner; a digital audio player may be used to carry computer files for use on different computers; a digital audio player may have more data interface, such as an infrared transceiver or wireless radio frequency transceiver, to exchange data with a computer. However, if a portable digital audio player integrates all these features in a conventional manner, the firmware implementation becomes excessively complicated and the portability, durability and manufacturability of the digital audio player is sacrificed.

Second, there is still no satisfactory solution to expand the memory storage capability of digital audio players. Most portable digital audio players in the marketplace use flash memory cards, such as MMC™, SmartMedia™ cards, and CompactFlash™ cards, to store the digital music. These flash memory cards can only hold a very limited amount of digital music. For example, a 64 MB CompactFlash card stores approximately 60 minutes of music in MP3 format compressed at low quality. To expand the music storage capability, some digital audio players have an expansion slot to receive external flash memory cards. However, the flash memory cards are easily breakable and the addition of memory cards can negatively affect the industrial design and durability of digital audio players.

In addition, a mechanism to permit different personal digital devices to share same type of digital memories is needed. Currently, many consumer electronics product, such as handheld devices, digital cameras and digital video camcorders, use digital memories. Some of these devices use flash memory cards; others embrace new types of memories such as miniature hard drives and optical disks. All these digital memories are expensive. Therefore, a user may want to use a flash memory card from a digital camera to store digital music on his or her digital audio player. Thus, allowing the memories to be reused, a digital audio player needs to be flexible with different types of digital memories.

There is also a need to use different types of power sources for a digital audio player based on a user's need. For example, different users may want to use different batteries on their digital audio player. Some prefer disposable alkaline batteries while other may prefer rechargeable NiMH batteries or Lithium Ion batteries.

Therefore, what is needed is a digital audio player with a flexible mechanism to permit users to personalize the features of their digital audio player. In particular, the digital audio player is capable of interoperating with different removable multi-function components for performing different tasks. The digital audio player also provides an improved solution for memory upgrades and memory sharing.

SUMMARY OF THE INVENTION

The present invention overcomes the deficiencies and limitations of prior art by providing a digital audio player capable of receiving a single function or multi-function removable module. The present invention comprises a personal digital audio player having a body and a plurality of interchangeable modules, each of which performs different functions. The interchangeable modules are removably interconnected to the body of the digital audio player.

The interchangeable multi-function module comprises a connection interface and at least one operating member. Each of the operating members performs a specified function for the digital audio player. One embodiment of the multi-function modules includes an additional memory storage device and a battery. In accordance with one aspect of the present invention, the additional memory storage device may be a flash memory card or a mass storage drive. The additional memory storage provides a convenient means for memory expansion and upgrade. A second embodiment further provides a multi-function module which comprises a memory interconnect socket. Compatible digital memories are thus sharable between different digital devices through the memory interconnect socket. Another embodiment provides a multi-function module with a battery, an antenna and an FM radio tuner. The FM tuner module provides an additional source for music output by the digital audio player.

In accordance with the present invention, other embodiments of the multi-function module include an infrared transceiver or a wireless transceiver. The infrared transceiver and wireless transceiver provide the digital audio player with optional input and output devices so that the digital audio player can wirelessly exchange data or programs with other devices.

These and other features and advantages of the present invention may be better understood by considering the following detailed description of an embodiment of the invention. In the course of this description, reference will frequently be made to the attached drawings.

BRIEF DESCRIPTION OF THE DRAWINGS

FIG. 1A is a perspective view of an embodiment of the digital audio player including a body and a removable multi-function module in accordance with the present invention.

FIG. 2 illustrates a block diagram of a digital audio player with a removable multi-function module in accordance with the present invention.

DETAILED DESCRIPTION OF THE INVENTION

Figure 1B:
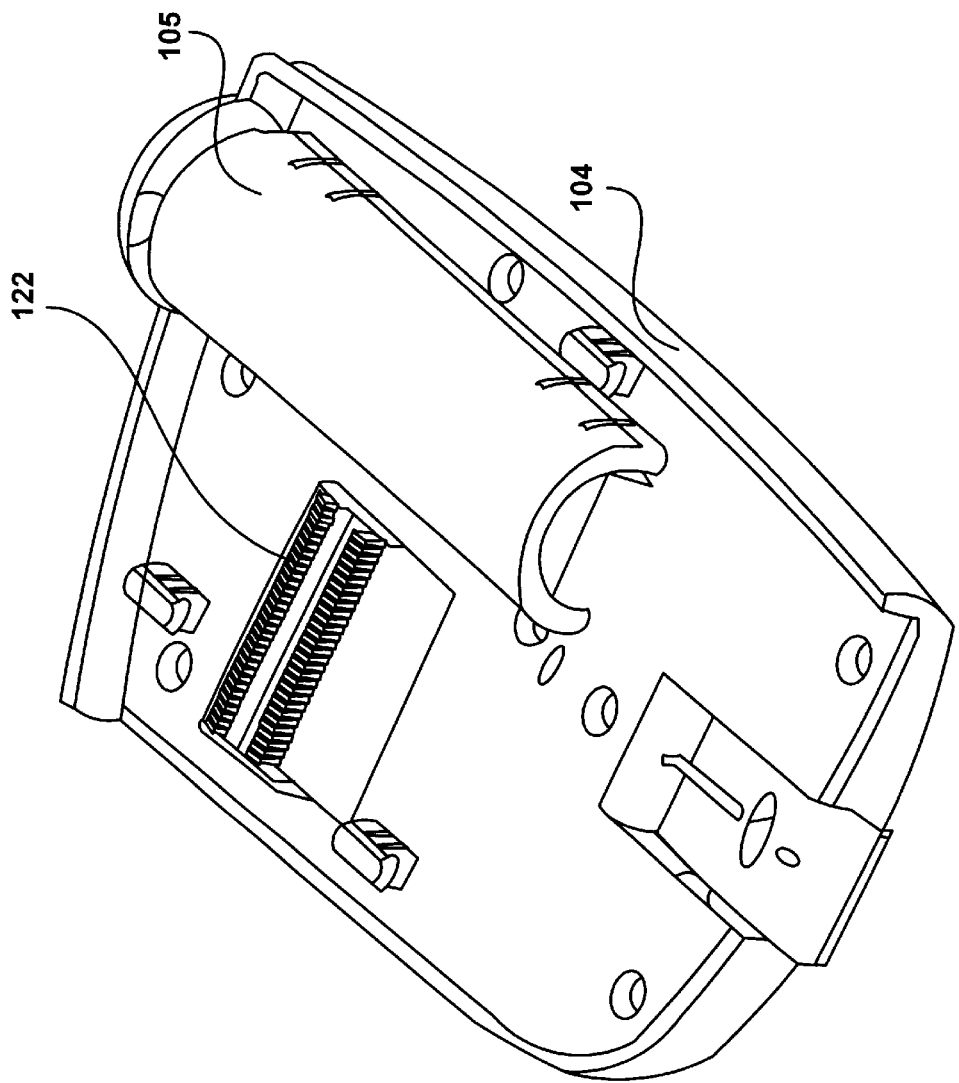
FIG. 1B is a perspective view of an embodiment of a removable multi-function module in accordance with the present invention.

FIG. 1A is a perspective view of an embodiment of a digital audio player 100 including a body 102 and a removable multi-function module ("module") 104 in accordance with the present invention. As shown in FIG. 1, the outer surface of the body 102 comprises a display unit 108, control buttons 110, and a data interface 112. In accordance with the present invention, the digital audio player 100 is capable of performing a variety of functions. As shown below, each embodiment of the module 104 possesses a single or multiple functions. The embodiments of the module 104 are interchangeably coupled to the body 102 according to a user's needs.

FIG. 1B is a perspective view of the removable multi-function module 104. FIG. 1B illustrates the module 104 includes an interface 122. The interface 122 couples the module 104 to the body 102. As describe below, the module 104 comprises at least one operating members to perform a single or multiple functions. For example, a battery 105 is shown as part of the module.

FIG. 2 is a block diagram further illustrating the components in the digital audio player 100. The body 102 includes an audio output 106, the display unit 108, the control buttons 110, the data interface 112, an input/output port 114, a ROM (Read Only Memory) 116, a RAM (Random Access Memory) 118, a combined Digital Signal Processor and controller ("DSP") 120 and an interface and control module 128. The above referenced components in the body 102 are coupled by a data bus 130. Those skilled in the art will recognize that these components may be coupled in other ways. For example, the ROM 116, the RAM 116 and the DSP 120 may be combined together on a single chip; or the ROM 116 and the RAM 116 may be integrated on one chip. The digital audio player 100 may further comprise a headset 127, which is coupled to the audio output 106.

The module 104 includes the interface 122 and a first operating member 124 and a second operating member 126. The two operating members are both coupled to the interface 122. The operating members 124 and 126 are provided for performing additional functions for the digital audio player 100. As will be described below, the operating members 124 and 126 can be implemented in a variety of forms to provide multiple functions for the digital audio player 100. For example, the operating member 124 may be a battery providing power to the digital audio player 100, and the operating member 126 may be a memory storage device to store music or other data files.

It should be understood that alternate embodiments of the module 104 may include only one operating member to perform a single function to the digital audio player 100. Such an alternate embodiment with a single operating member is still interchangeable with other embodiments including one or more than one operating members.

Figure 3:
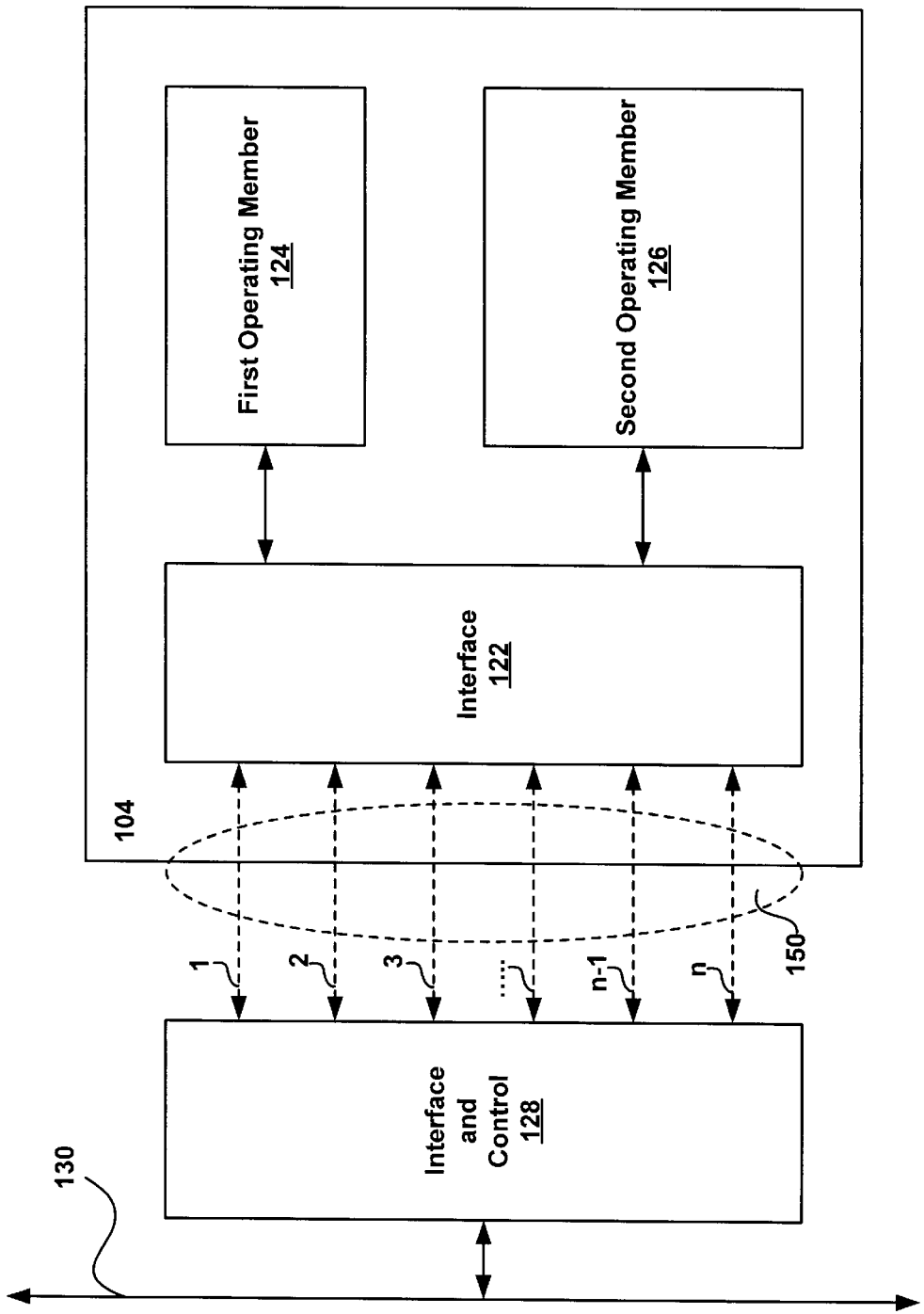
FIG. 3 illustrates a block diagram of the connection interface on a removable multi-function module and a digital audio player body in accordance with the present invention.

FIG. 3 is an illustration of the interface and control module 128 in the body 102 and the interface 122 in the module 104. The first operating member 124 and the second operating member 126 in the module 104 are coupled to the body 102 via the interface 122. In one embodiment in accordance with the present invention, the interface 122 may be a conventional male 32-pin connector. The interface and control module 128 is the corresponding female 32-pin connector. Each of the pins within the 32-pin connector is assigned for a specific purpose. For example, pins 1 and 3 are used for the battery power; pins 10 and 11 are used for address line 11; pins 20 and 22 are used for data line. Those skilled in the art will recognize that various other connectors could be used for the interface such as a 64-pin connector.

The interface 122 in the module 104 and the interface and control module 128 in the body 102 enable the body 102 to operate with a variety of operating members, for example, the operating member 124 and 126 in the module 104. For example, when a new type of the module 104 is coupled to the body 102, the DSP 120 within the body 102 is configured to recognize the new module; then the body 102 may receive power from a battery through the pins 1 and 3 as represented by line 1 of the connection 150 shown in FIG. 3. The body 102 may also read data from the second operating member 126 through the pins 20 and 22 as represented by lines 2–13 of the connection 150 shown in FIG. 3. Likewise, the body 102 operates with a plurality of embodiments of the module 104 that include different operating members without changing the interface and control module 128 and the interface 122. Therefore, as further illustrated below, the present invention provides interchangeable multi-function modules to operate with a digital audio player. To achieve a new function for a digital audio player, a user may simply remove one multi-function module and use another module with a desirable function.

Figure 4:
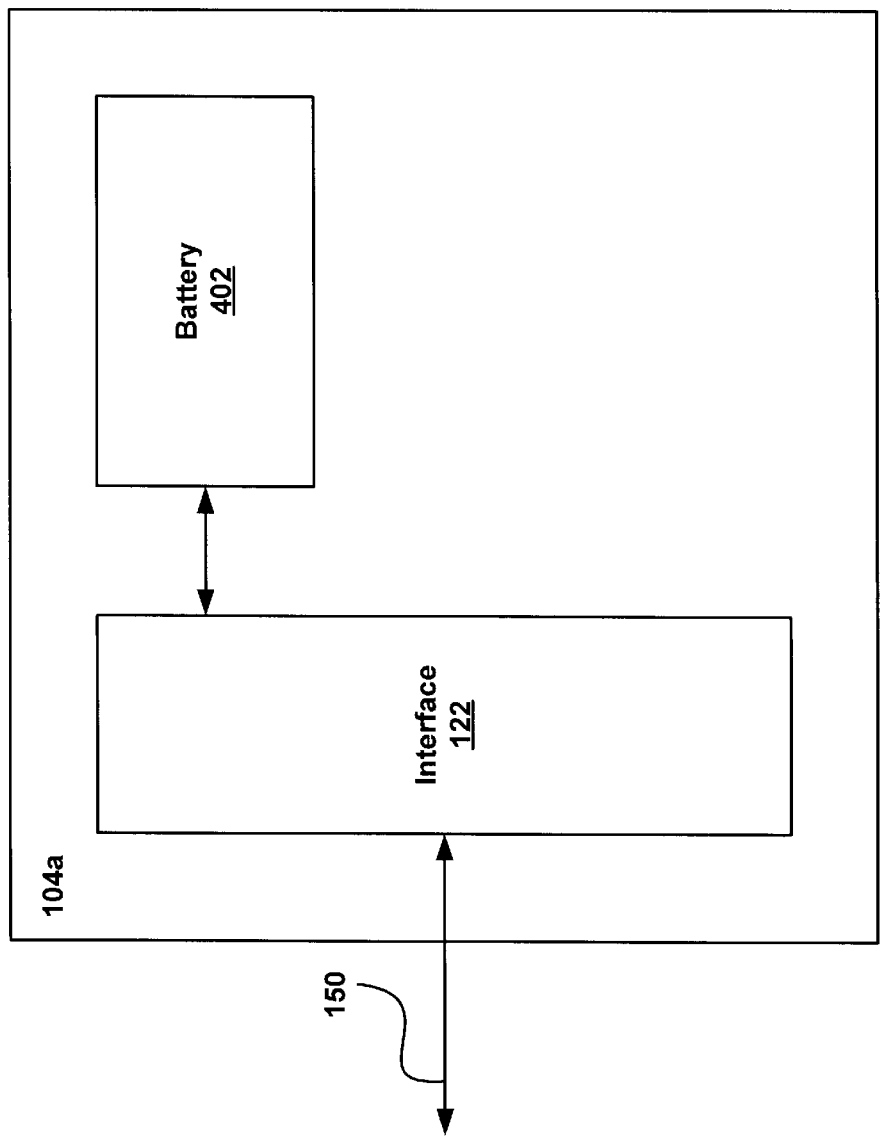
FIG. 4 is a block diagram of an embodiment of a removable multi-function module which includes a battery in accordance with the present invention.

FIG. 4 illustrates a first embodiment of a module 104a that includes a battery 402 in accordance with an embodiment of the present invention. The module 104a with the battery 402 provides power to the digital audio player body 102 via the connection 150. In one embodiment, the battery 402 may be a conventional Alkaline battery, a NiMH battery or a Lithium Ion battery. The module 104a may be the default module for the digital audio player 100. This embodiment provides a user a great convenience to choose different types of batteries for a digital audio player. For example, a user may select a module 104a which is compatible with a Lithium Ion battery for its long run time. As described below, a user may also choose a module using a rechargeable NiMH or Lithium Ion battery for repeated usage.

Unless otherwise indicated, the battery 402 can also be used as a power source with other operating members in other embodiments in accordance with the present invention even though it may not be explicit that a battery 402 or a power source is included in the embodiments described herein.

Likewise, it should be understood that the operating members 124 and 126 in the embodiments described hereinafter may also be used in combination with each other dependent upon the functions and features needed by users.

Figure 5:
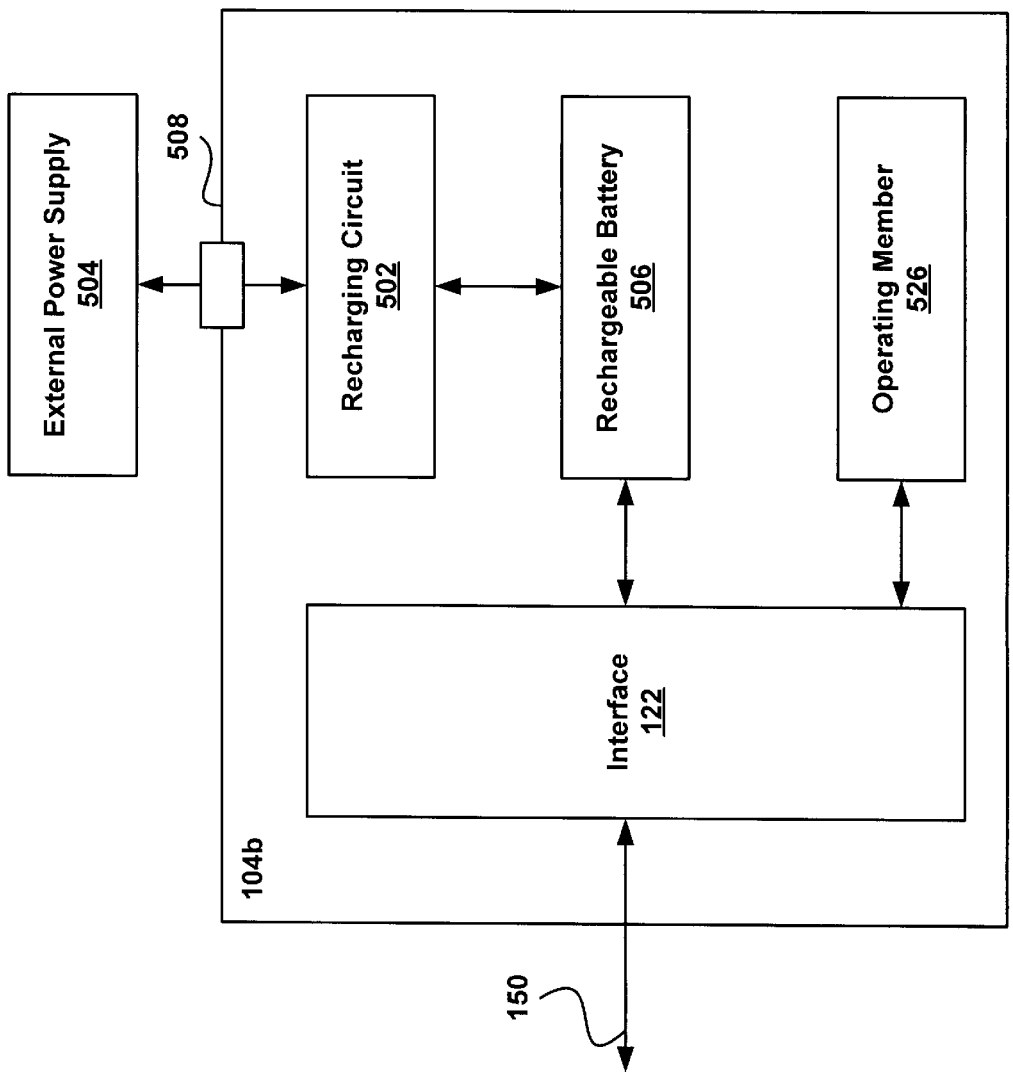
FIG. 5 is a block diagram of an embodiment of a removable multi-function module including a recharging circuit in accordance with the present invention.

FIG. 5 shows a second embodiment of module 104b including a recharging circuit 502, a rechargeable battery 506, the interface 122, a connector 508, and an operating member 526 in accordance with the present invention. The recharging circuit 502 is capable of being coupled to an external power supply 504 via a conventional connector 508. When the rechargeable battery 506 is at low power level, the recharging circuit 502 recharges the battery 506. The recharging circuit 502 is of a conventional type known to those skilled in the art. One of ordinary skill in the art would recognize that there are different commonly known techniques to implement the battery recharging function.

Figure 6:
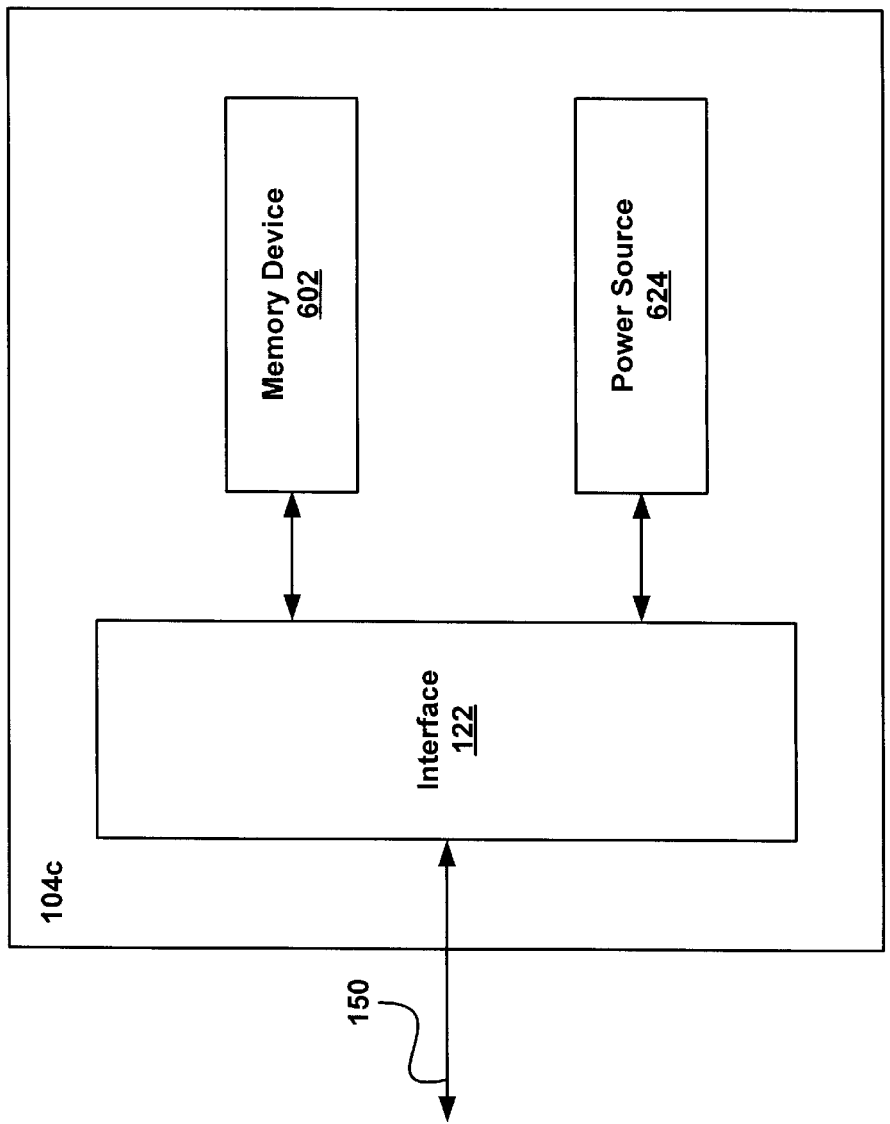
FIG. 6 is a block diagram of an embodiment of a removable multi-function module including a flash memory device in accordance with the present invention.

FIG. 6 illustrates a third embodiment of a module 104c which includes a memory device 602 and a battery 624 in accordance with the present invention. In a preferred embodiment, the memory device 602 is a flash memory. Flash memories may be packaged as "flash cards" in several formats, including the full-size PC Card and the smaller CompactFlash, SmartMedia or similar formats. There are two types of flash interfaces: the earlier linear flash, which requires Flash Translation Layer (FTL) or Flash File System (FFS) software to make it look like a disk drive to a digital signal processor; and the ATA interface, which has been widely used for hard disks and has the same 512-byte block (sector) size. One skilled in the art would recognize either of these or various other implementations of the flash memory interfaces described above in practicing this aspect of the present invention.

During the operation of the digital audio player 100, when the module 104 is attached to the body 102, the DSP 120 sends a probing signal through the body interface 128 and the module interface 122. After the probing signal detects the existence of the memory device 602 in the module 104, the DSP 120 determines the type and size of the memory device 602. The DSP 120 further assigns addresses to the memory device 602 so that the DSP 120 addresses the memory device 602 and performs data operation such as reading data from or writing data into the memory device 602. In a preferred embodiment, the type of memory device 602 is the same as that of the RAM 118 in the body 102. For example, the RAM 118 is a 32 MB MMC memory and the memory device 602 is a 64 MB MMC memory card.

The advantage of this embodiment is to provide a convenient mechanism for memory expansion for the digital audio player 100. When a user wants to expand the music storage capability, he or she may simply use a module 104c which has a larger memory device 602. Further, since the module 104c is interchangeable with any other modules herein described, when a user does not need the additional memory storage, the user may conveniently replace the module 104c with any other multi-function modules.

Figure 7:
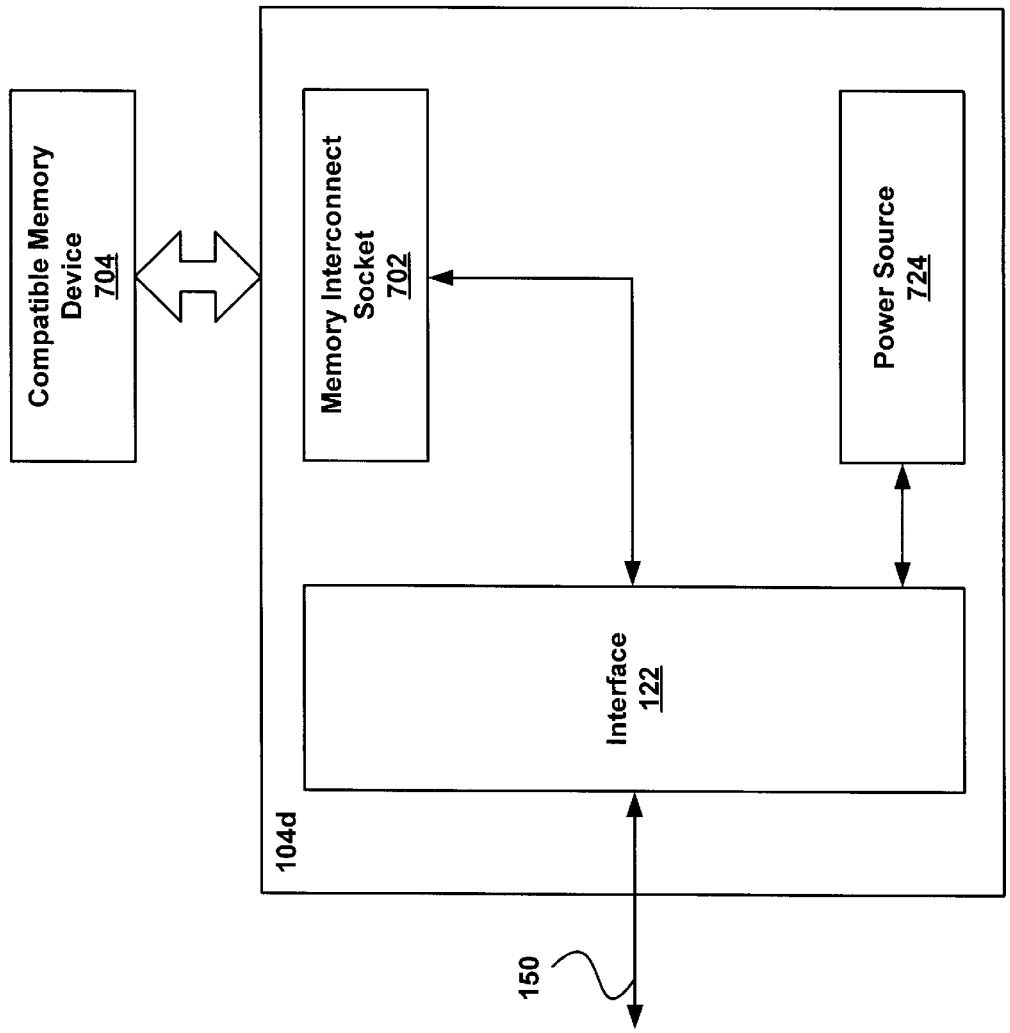
FIG. 7 is a block diagram of an embodiment of a removable multi-function module including a memory interconnect socket in accordance with the present invention.

FIG. 7 shows a fourth embodiment of a module 104d including the interface 122, a power source 724 and a memory interconnect socket 702 for receiving compatible types of memory devices in accordance with an embodiment of the present invention. For example, the flash memory cards, such as MMC™, Smartmedia™, CompactFlash™ flash memory cards or Sony® memory stick™, or any other market general-use flash memory media, may be inserted into a compatible memory interconnect socket 702 to provide optional memory storage for the digital audio player 100. This embodiment is particularly useful because it allows different digital devices to share the use of digital memories. For example, a user may easily erase the digital image files that are taken by a digital camera and stored on a CompactFlash card; and later insert the card into a CompactFlash compatible memory interconnect socket on the module 104d to make it available for the digital audio player 100. Alternately, different CompactFlash memories may be used to store different music, and then the user may easily change the music available by inserting or removing different CompactFlash memories from the memory interconnect socket 702.

The memory interconnect socket 702 is a commercially available product, for example, a Tyco Electronics MMC connector. The memory interconnect socket 702 is coupled to the interface 122 in commonly known techniques. For example, a MMC interconnect socket 702 is coupled to the interface 122 by serial lines.

Figure 8:
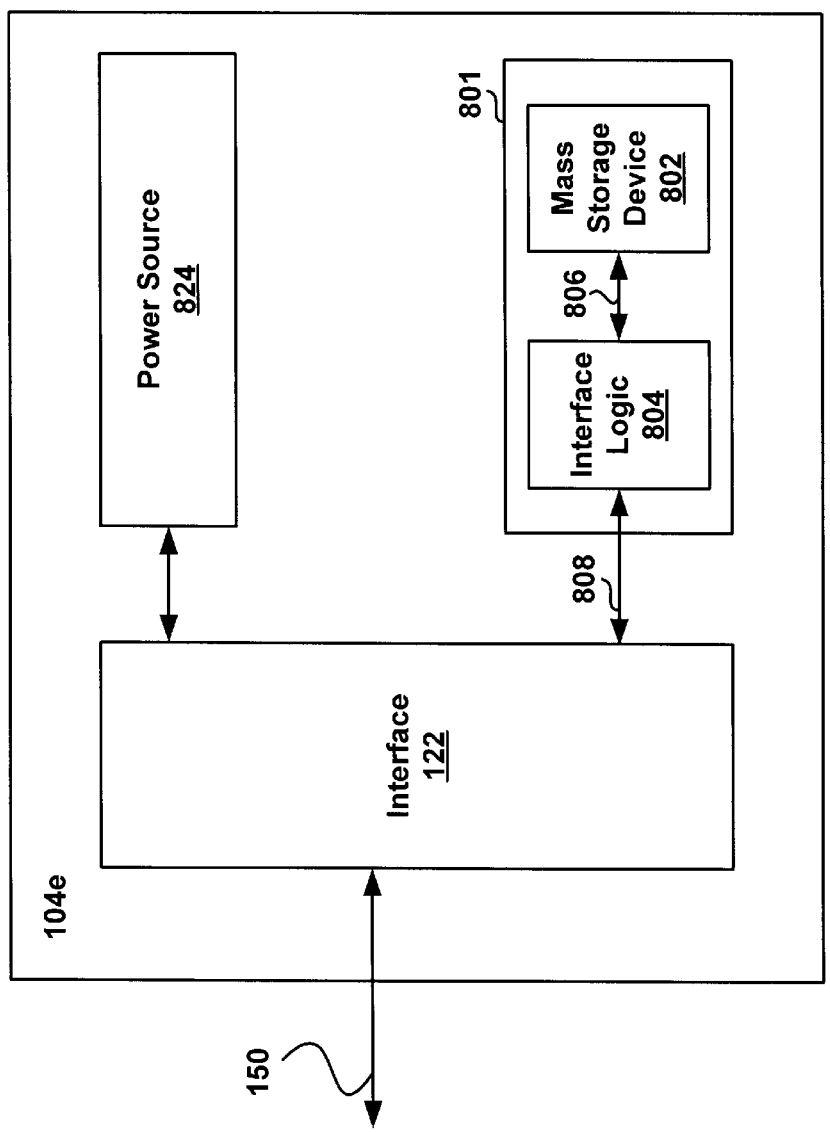
FIG. 8 is block diagram of an embodiment of a removable multi-function module including a mass storage device in accordance with the present invention.

FIG. 8 shows a module 104e including a power source 824 and a mass storage module 801 according to an embodiment of the present invention. The mass storage module 801 includes a mass storage device 802 and an interface logic 804. The mass storage module 801 is coupled to the interface 122 through a signal line 808.

The mass storage module 801 provides a large storage capacity for the body 102. In accordance with one aspect of the present invention, the body 102 may quickly and conveniently access the data in the mass storage device 802.

In the embodiment as illustrated in FIG. 8, the mass storage device 802 comprises a miniature hard drive, e.g., a microdrive manufactured by IBM Microdrive™ technology, which offers a removable high capacity storage ranging from 340 MB to 1 GB in a one-inch hard disk drive at much lower cost. Other alternate embodiments of the mass storage device 802 include an optical disk, a non-moving high density storage device or a rotating media. The embodiment shown in FIG. 8 provides a cost-effective means to significantly expand the storage size of the digital audio player 100. These mass storage devices store large size of digital music files at a lower cost than the flash memory cards.

As further illustrated in FIG. 8, the interface logic 804 is coupled between the interface 122 and the mass storage device 802. The function of the interface logic 804 is to perform a translation of data from the module bus format to a format suitable for the mass storage device 802. The interface logic 804 may be a CPLD (Complex Programmable Logic Device), FPGA (Field Programmable Gate Array), ASIC (Application Specific Integrated Circuits), a microprocessor, a microcontroller, or discrete logic. For example, if the mass storage device 802 as in the case of connecting an IDE/ATA type laptop hard drive to the body 102, it requires that an 8-bit wide data bus 808 for the module 104e be converted into a 16-bit wide data bus 806 for the IDE interface and the IDE registers are mapped into the body 102's memory space. After the hard drive is memory-mapped into the body 102 address space, the body 102 directly controls the hard drive.

Figure 9:
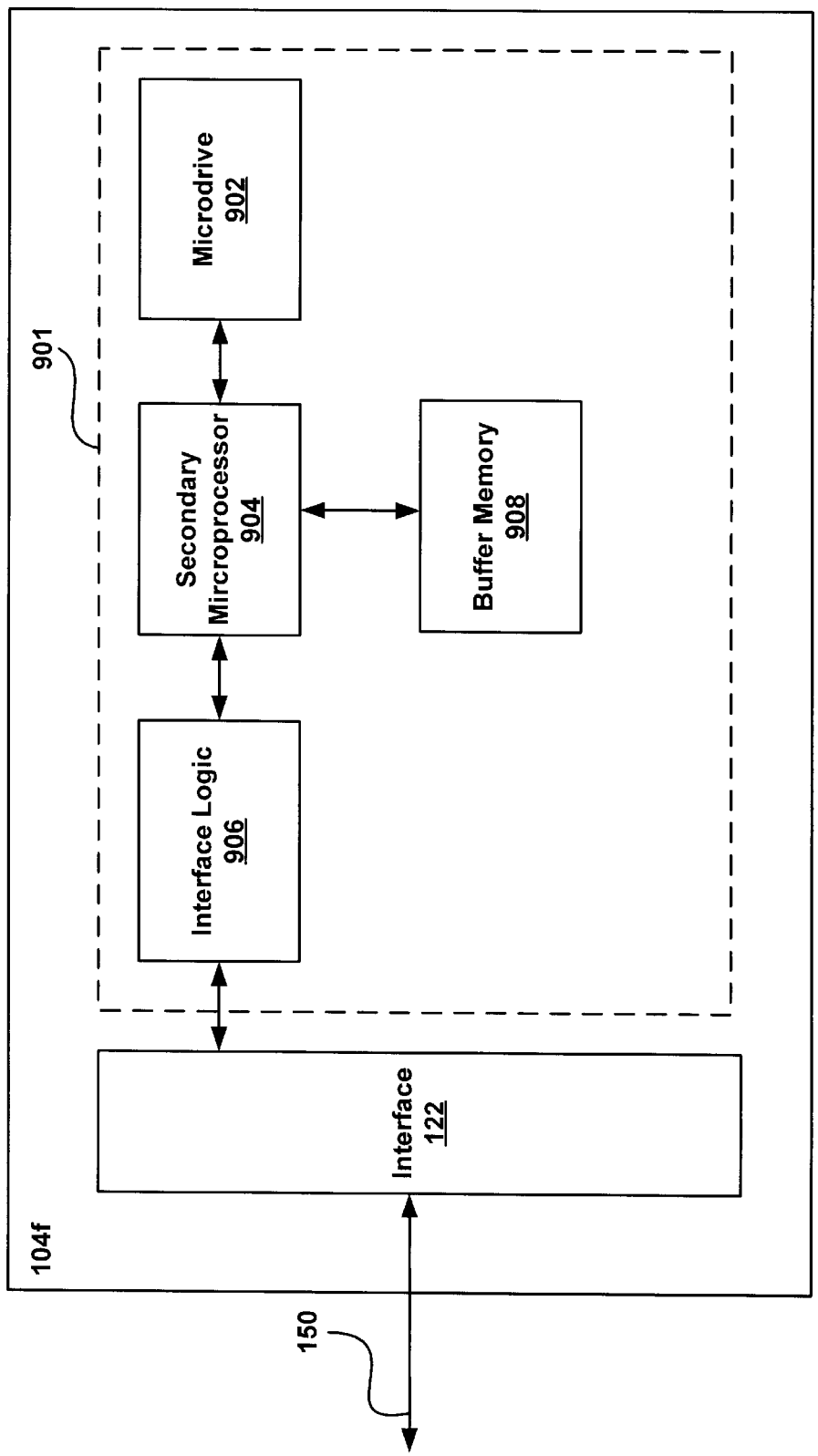
FIG. 9 is a block diagram illustrating an alternate embodiment of a removable multi-function module including a mass storage device in accordance with the present invention.

FIG. 9 illustrates a sixth module 104f that includes a mass storage device in accordance with the present invention. The module 104f includes the interface 122 and a mass storage device 901. The mass storage device 901 includes a miniature hard drive 902, an interface logic 908, a secondary microprocessor 904, and a buffer memory 908.

In this embodiment, the secondary microprocessor 904, for example, an ARM7TDMI control processor, is used to handle all the low-level transactions with the miniature hard drive 902. The secondary microprocessor 904 thus handles the mass-storage management tasks which are performed by the digital signal processor 120. As a result, it reduces the firmware setting on the body 102.

The secondary microprocessor 904 also supports the additional buffer memory 908 for buffering data for the miniature hard drive 902. The buffer memory 908, which is, for example, a 16 MB SDRAM (Synchronous Dynamic RAM), allows for faster buffering the music data stored in the miniature hard drive 902 and consequently a more frequent power-down for the miniature hard drive 902, thus saving the power and the overall battery life.

The body 102 and the secondary microprocessor 904 communicate through the interface logic 906 by means of a message "mailbox" scheme where the interface logic 906 acts as a small dual-port memory where commands and data are transmitted between the body 102 and the module 104f.

In one embodiment, the miniature hard drive 902 is an IBM Microdrive product. The miniature hard drive 902 can be replaced with other massive storage devices, such as optical disks, e.g., a Dataplay® optical disk media, which provides up to 500 MB storage space. Those skilled in the art would know the implementation of the present invention upon the embodiments which use other massive storage devices.

Figure 10:
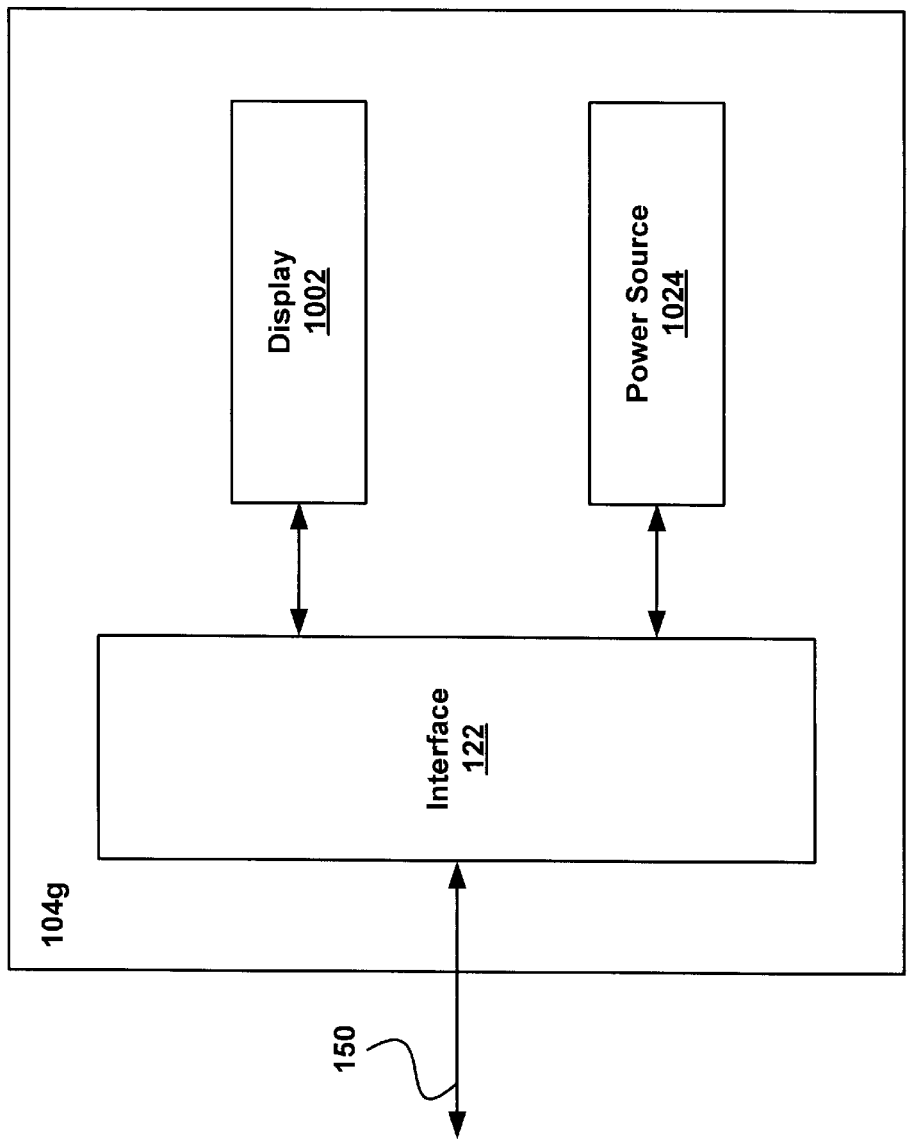
FIG. 10 is a block diagram illustrating an embodiment of a removable multi-function module including an additional display unit in accordance with the present invention.

FIG. 10 shows a seventh module 104g including a display unit 1002 and a power source 1024 in accordance with the present invention. The display unit 1002 may be a LCD (Liquid Crystal Display) device.

In accordance with one aspect of the present invention, the additional display unit 1002 on the module 104g provides the digital audio player 100 with a display option adapted to the consumer needs. For example, if the size of the display unit 108 on the body 102 is not large enough for certain purpose, e.g., displaying lyrics while playing the music, a larger LCD screen on the module 104g is desirable. In addition, the DSP 120 may be programmed to display clock information and time alarm on the LCD screen on the module 104g. Thus, the digital audio player 100 can be used as a multi-functional digital alarm clock.

Figure 11:
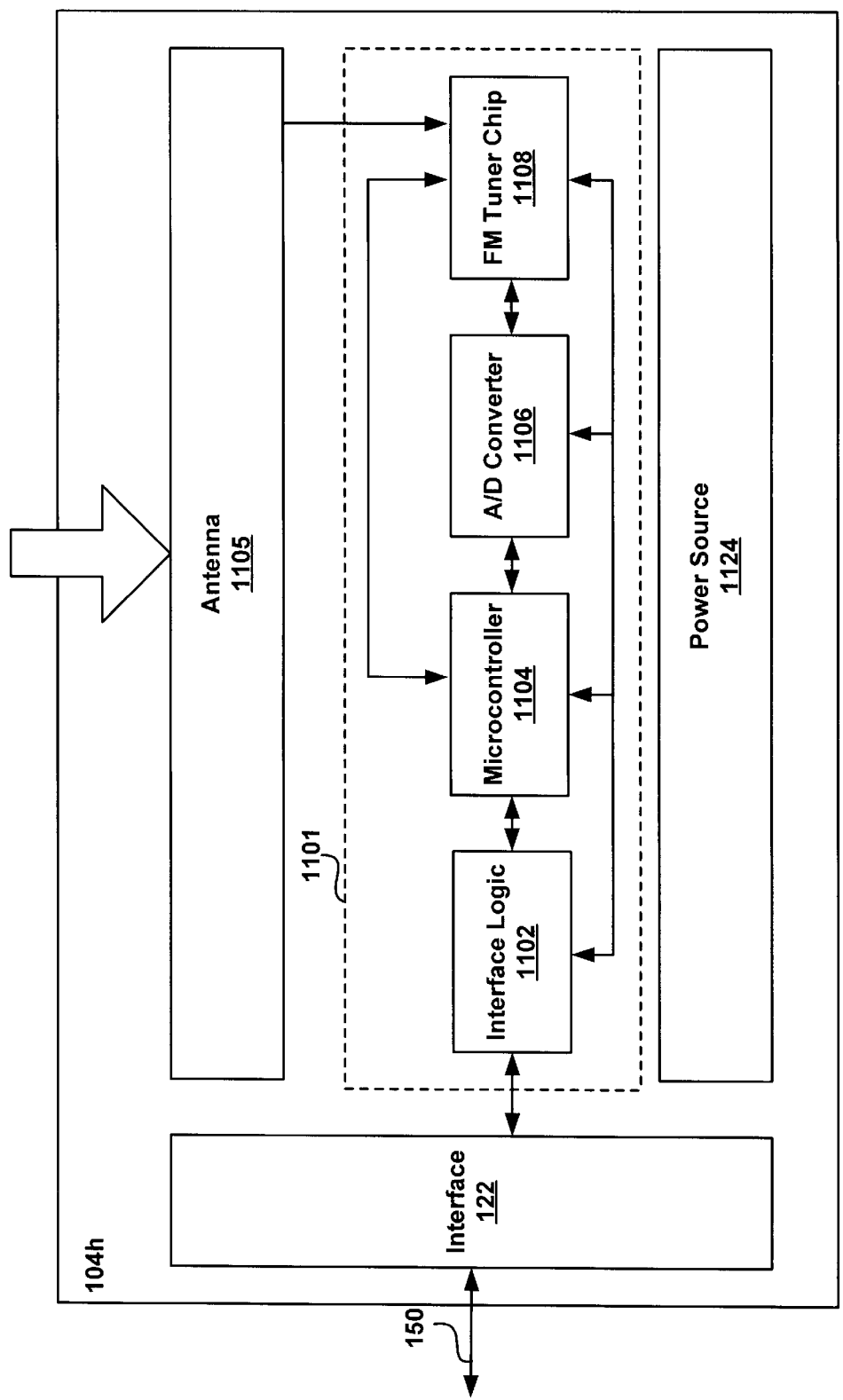
FIG. 11 is a block diagram of an embodiment of a removable multi-function module including a FM tuner in accordance with the present invention.

FIG. 11 shows yet another embodiment of a module 104h which includes an FM tuner 1101, an antenna 1105 and a power source 1124 according to the present invention. The FM tuner 1101 is connected to the body 102 through the module interface 122. The FM tuner 1101 is also coupled to the antenna 1105.

As shown in FIG. 11, the FM tuner 1101 further comprises an FM tuner circuit 1108, an Analog/Digital (A/D) converter 1106, a microcontroller 1104 and an interface logic 1102.

In one embodiment, the FM tuner circuit 1108, for example, a Philips TEA5759, receives FM signals from the antenna 1105, which is a conventional component used for FM radio reception. The FM tuner circuit 1108 is further connected with proper anti-aliasing filter and level adjustment to a two-channel serial A/D converter 1106. The A/D converter 1106 converts the analog audio outputs from the FM tuner circuit 1108 into an uncompressed digital stream. The A/D converter 1106 and the FM tuner circuit 1108 are controlled by a microcontroller 1104. The microcontroller 1104, for example, an 8-bit Atmel AT90S1200 RISC chip, instructs the FM tuner circuit 1108 to tune to particular channels, and collects the uncompressed samples from the A/D converter 1106.

The microcontroller 1104 communicates to the body 102 through the interface 122 by way of the interface logic 1102. In one embodiment in accordance with the present invention, the interface logic 1102 is a CPLD, which comprises 32 macrocells. The interface logic 1102 provides two 10-bit registers for the microcontroller 1104 so that the microcontroller 1104 places a pair of stereo, 10-bit samples into the Left and Right sample registers at each time constant (1/44100th of a second, for example). When all 10 bits of each sample have been latched into the interface logic 1102, an interrupt is generated to the body 102 by the interface logic 1102 over the module interface 122. The interrupt signals the body 102 to retrieve the data and play it through the digital audio player 100's output signal processing.

To control the operation of the FM tuner 1101, the body 102, in particular, the DSP 120, sends a single (N-bit) command at a time to the microcontroller 1104 through the interface logic 1102. Writing the command register in the interface logic 1102 by the body 102 results in the "/MSG" line asserting on the interface logic 1102 which triggers an interrupt alerting the microcontroller 1104 that it has received a command and acts according to the command. The commands sent by the body 102 include entering and exiting low power mode, tuning the radio, setting or moving to a preset station, returning the state of the FM radio such as tuned, not-tuned, mono, or stereo, etc. Commands that require more than one byte can be accommodated by multiple writes to the register in the interface logic 1102.

During the operation of the FM tuner module 104h, the FM stereo radio signal may be sampled at 44.1 KHz and each sample is read and written into the interface logic 1102 within approximately 22.5 us. If the 44.1 KHz interrupt rate overloads the interface logic 1102, the sampling rate can be reduced to 32 KHz. Alternatively, to avoid the overloading problem, a larger CPLD chip may be used for the interface logic 1102 and 2–3 samples of FIFO are provided by reducing the interrupt rate by 2 or 3 times.

In one embodiment of the FM tuner 1101, the microcontroller 1104 may be an ARM processor, e.g., the ARM7TDMI. One of ordinary skills in the art would also recognize to use other commercially available products to suffice the I/O usage requirement for the interface logic 1102 and the microcontroller 1104. In accordance the present invention, the microcontroller 1104 may be eliminated entirely if the interface logic 1102 is replaced by an FPGA running a state machine to control the peripherals.

In addition, for the embodiment shown in FIG. 11, if the power source 1124 is a Lithium Ion battery with a recharge controller, the microcontroller 1104 communicates with the 2-wire interface on a recharge controller and provides accurate battery "gas gauge" functionality to the body 102. For non-Lithium Ion batteries, in one embodiment, an A/D converter 1106 with more than two channels (or add an external analog Multiplexor) directly reads the battery voltage on an Alkaline or NiMH battery.

Figure 12:
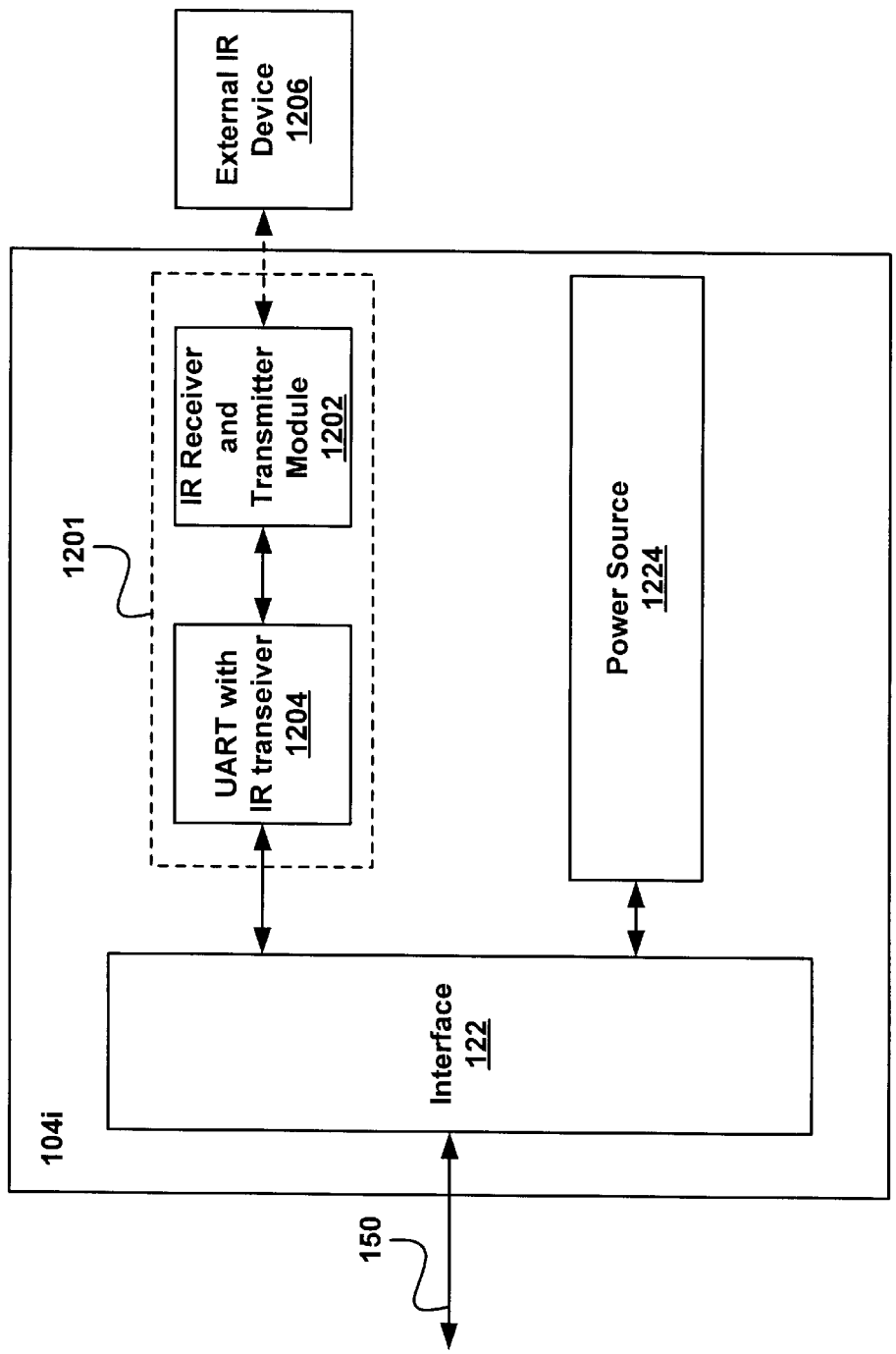
FIG. 12 is a block diagram of an embodiment of a removable multi-function module including an IR transceiver in accordance with the present invention.

FIG. 12 shows a module 104*i* including a power source 1224, the interface 122, and an Infrared (IR) transceiver 1201. In one embodiment in accordance with the present invention, the IR transceiver 1201 is an IrDA (Infrared Data Association) port. Supported by the IrDA Serial IR physical layer (IrDA-SIR), the IR transceiver 1201 may provide a half-duplex connection of up to 115.2 Kbps with an external IrDA device 1206. One of ordinary skills in the art would recognize to implement the IR transceiver 1201 to transfer data with external IrDA devices in higher speed. The advantage of this IR transceiver module 104*i* is to provide an new input/output interface so that the digital audio player 100 can wirelessly exchange data with other devices having IR interface, such as an mobile computer or a handheld device, without a parallel cable or USB cable connection. In this way, the digital audio player 100 can be integrated in a personal area network (PAN) for other advanced applications. For example, with the IR transceiver module 104*i*, the digital audio player 100 may "beam" the files stored in its memory to a mobile computer; the mobile computer may send software updates into the digital audio player 100 through the IR transceiver 1201.

FIG. 12 further shows that the IR transceiver 1201 includes an IR Receiver and Transmitter Module 1202 and a UART 1204 (Universal Asynchronous Receiver Transmitter) with IR transceiver support.

The UART 1204 is a low power circuit that makes up a serial port and converts parallel bytes from a microprocessor into serial bits for transmission, and vice versa. During the operation, the DSP 120 in the body 102 is configured to implement applicable IrDA protocols, such as Infrared Link Access Protocol, to control the data to transmit over the interface 122 and deliver the data in parallel to the UART 1204. The UART 1204 serializes the data and sends it out as modulated IR pulses to the IR Transmitter portion in the IR Receiver and Transmitter Module 1202, which in turn transmits the data to the external IR device 1206.

Data received from the external IR device 1206 is demodulated by the IR Receiver portion of IR Receiver and Transmitter Module 1202 and sent in serial to the UART 1204. The UART 1204 then converts the serial stream into parallel data, which are made available to the body 102 over the module interface 122. To achieve faster IR transmission speed, one of ordinary skilled in the art would recognize to use non-UART components for high-speed extensions.

Figure 13:
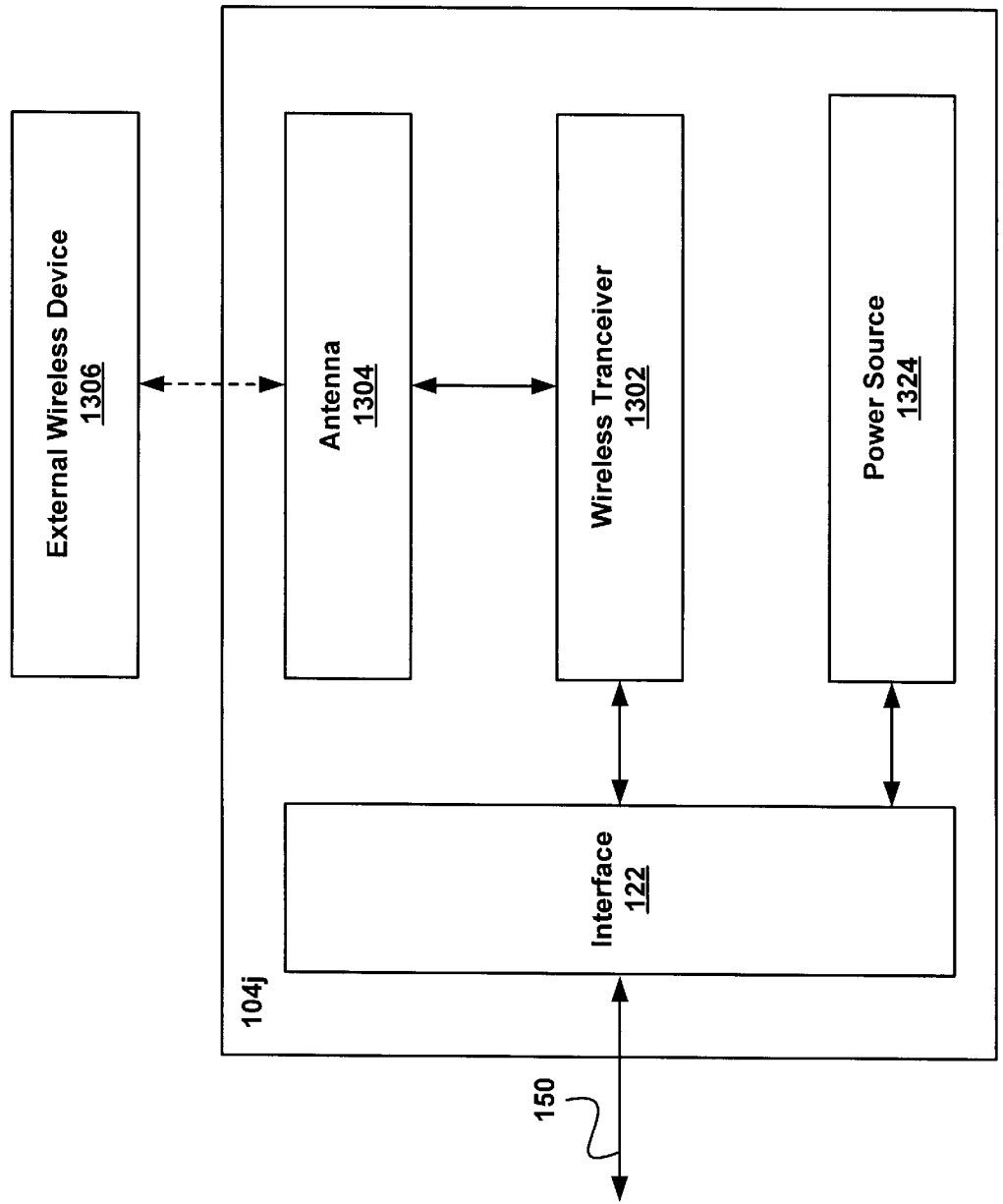
FIG. 13 is a block diagram of an embodiment of a removable multi-function module including a wireless transceiver in accordance with the present invention.

FIG. 13 further shows a module 104*j* including the interface 122, a power source 1324, a wireless transceiver 1302 and an antenna 1304.

The wireless transceiver 1302 enables the digital audio player 100 to communicate with other wireless devices using radio frequency or other commonly known techniques. In one embodiment, the wireless transceiver 1302 receives radio frequency signals from an external wireless device 1306, which detects the heart beats of a human being. The wireless transceiver 1302 converts the radio frequency signals representing the heart beats into digital signals and sends them to the DSP 120 over the interface 122. The DSP 120 is configured to process the digital signals and to calculate the corresponding heart rate and to display the result on its display unit 108. Thus, the digital audio player 100 with the wireless transceiver module 1302 becomes a heart rate monitor, which is convenient for a person who carries the digital audio player while exercising in a fitness room or having physical training outdoors.

Figure 14:
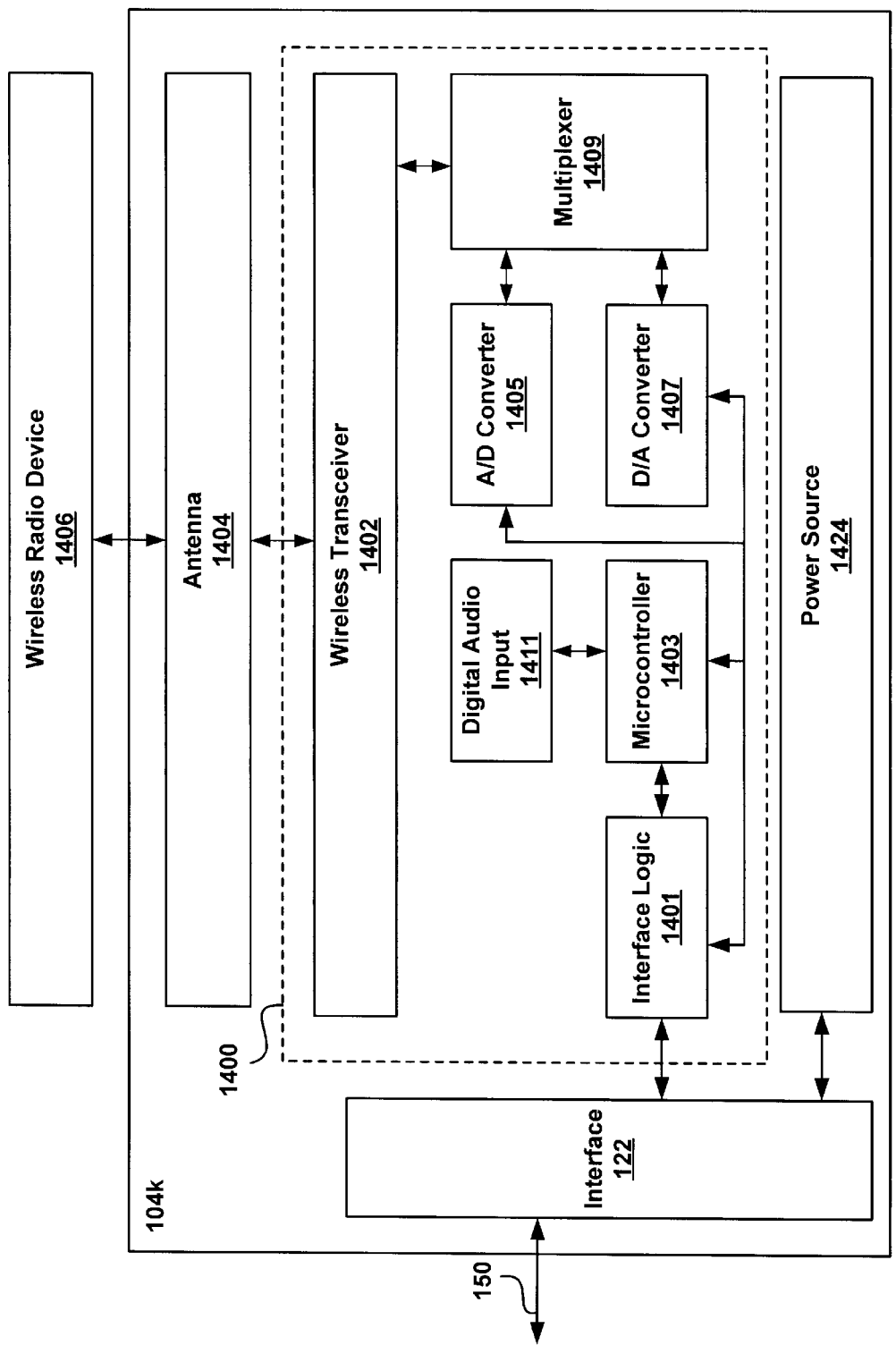
FIG. 14 is a block diagram of an embodiment of a removable multi-function module including a two-way radio module in accordance with the present invention.

FIG. 14 illustrates a module 104*k* including an alternative embodiment 104*k* which also enables the digital audio player to wirelessly communicate with another wireless device.

FIG. 14 illustrates that the module 104*k* includes a two-way radio module 1400. The function of the module 104*k* is to make the digital audio player 100 become a two-way radio electronics product. A user may conveniently use this module 104*k* with the digital audio player 100 to talk to another user within certain range via radio signals.

In one embodiment, the two-way radio module 1400 includes a Wireless Transceiver 1402, a Multiplexer (MUX) 1409, a Analog to Digital (A/D) converter 1405, a Digital to Analog (D/A) converter 1407, a Microcontroller 1403, a Interface Logic 1401, and a Digital Audio Input. 1411. FIG. 14 shows that the module 104*k* may also include a power source 1424 and an Antenna 1404.

The Wireless Transceiver 1402 is coupled to the MUX 1409. The MUX 1409 is respectively coupled to the A/D converter 1405 and the D/A converter 1407. The A/D converter 1405 and the D/A converter 1407 are coupled to the Microcontroller 1403 and the Interface Logic 1401 through an address bus and a data bus. The Digital Audio Input 411 is coupled to the Microcontroller 1403.

During the operation of the digital audio player 100 with the module 104*k*, the DSP 120 may be configured to control a two-way radio "talk" or "listen" mode. In a "talk" mode, the Digital Audio Input 1411, which may be a digital microphone, converts a user's voice into digital data stream. The Microcontroller 1403 further delivers the digital data stream to the D/A converter 1407, wherein the digital data stream is converted into analog signals. The multiplexer 1409 routes the analog signals to a transmitter in the wireless transceiver 1402. Through the Antenna 1404, the transmitter broadcasts the analog signals at a pre-selected channel to a Wireless Radio Device 1406. In a "listen" mode, the DSP 120 instructs a receiver in the Wireless Transceiver 1402 to receive analog signals from the Wireless Radio Device 1406. The Wireless Transceiver 1402 then feeds the analog signals into the Multiplexer 1409. The Multiplexer 1409 demodulates the analog signals and sends them to the A/D converter 1405, which converts the analog signals into digital data streams. The Microcontroller further transmits the digital data streams to the body 102 through the Interface Logic 1401 and the connection 150. Thus, a user may hear another user speaking to the Wireless Radio Device 1406 through the audio output 106.

It should be noted that if the two-way radio module 1400 is full-duplex, i.e., the Wireless Transceiver 1402 transmitting and receiving signals simultaneously, the MUX 1409 may not be needed. The A/D converter 1405 and the D/A converter 1407 may be directly coupled to the Wireless Transceiver 1402.

The two-way radio module 104*k* advantageously adds an appealing function to the digital audio player 100. A user does not need to buy a separate two-way radio product and simply places the two-way radio module to the body 102. A digital audio player 100 instantly becomes a two-way radio device.

It is to be understood that the specific mechanisms and techniques that have been described are merely illustrative of one application of the principles of the invention. Numerous additional modifications may be made to the embodiments described above without departing from the true spirit of the invention. Furthermore, new embodiments may be made by combining operating members from the described embodiments. For example, an alternate embodiment comprises an FM tuner and a flash memory card, which have been respectively described in FIG. 11 and FIG. 6. Another embodiment may include the mass storage device as illustrated in FIGS. 8 and 9 and the IR transceiver as illustrated in FIG. 12. None of the operating members in the described embodiments are exclusive from each other.

What is claimed is:

1. A digital audio player comprising:

a first unit mounted to a first housing portion for the digital audio player, being operative to process digital audio data and to output an audio signal; and a second unit mounted to a second housing portion of the outer surface for the digital audio player, coupled to the first unit, having an interface and a first operating member and at least one additional operating member, the second unit adapted for removable attachment to the first unit such that the first housing portion and the second housing portion form an enclosure.

2. A digital audio player according to claim 1, wherein the first operating member of the second unit comprises a battery.

3. A digital audio player according to claim 1, wherein the at least one additional operating member of the second unit comprises a memory storage device.

4. A digital audio player of claim 3, wherein the memory storage device comprises a hard drive.

5. A digital audio player of claim 3, wherein the memory storage device comprises an optical disk.

6. A digital audio player of claim 3, wherein the memory storage device comprises a flash memory card.

7. A digital audio player according to claim 1, wherein the at least one additional operating member of the second unit includes an antenna and a radio tuner.

8. A digital audio player according to claim 1, wherein the at least one additional operating member of the second unit comprises an antenna and an infrared transceiver.

9. A digital audio player according to claim 1, wherein the at least one additional operating member of the second unit comprises a memory interconnect socket.

10. A digital audio player according to claim 1, wherein the at least one additional operating member of the second unit comprises a display unit.

11. A digital audio player according to claim 10, wherein the display unit is a liquid crystal display.

12. A digital audio player according to claim 1 wherein the at least one additional operating member of the second unit comprises a battery recharging circuit.

13. A digital audio player according to claim 1, wherein the at least one additional operating member of the second unit comprises a wireless transceiver.

14. A module, removably coupled to a body of a digital audio player, for performing at least one function, the module comprising:

an interface to communicatively couple the module to the body of the digital audio player;

a first operating member, being operative to perform a first predetermined function; and at least one additional operating member, being operative to perform at least one additional predetermined function; and a housing portion configured to removably couple the module to the body, the housing portion cooperating with the body of the digital audio player to form an enclosure for the digital audio player.

15. A digital audio player, comprising:

a body forming a first portion of an outer surface forte digital audio player, to body comprising a digital processor and an interconnection module; and a plurality of interchangeable module units, the units being attachable to the digital audio player body, and forming a second portion of the outer surface when attached to the body, the plurality of interchangeable module units including a first operating member configured to perform a predetermined function, at least one additional operating member configured to perform one of a plurality of additional predetermined functions and a connecting structure.

16. A digital audio player comprising:

a first means forming a first housing portion being operative to process digital audio data and to output an audio signal; and a second means forming a second housing portion removably coupled to the first means, having an interface and a first operating member and at least one additional operating member;

the first housing portion and the second housing portion forming an enclosure for the digital audio player.

17. A digital audio player comprising:

a body means for processing digital audio data and for outputting an audio signal, forming a first housing portion for the digital audio player; and a plurality of interchangeable means for performing a first predetermined function, and at least one of a plurality of additional predetermined functions, and forming a second housing portion for the digital audio player, removably attachable to the body means, such that the first housing portion and the second housing portion form an enclosure.

18. A digital audio player comprising:

a body comprising a digital processor and an interconnection module, the body forming a first housing portion of the digital audio player; and a removable module comprising a flash memory device and a power source forming a second housing portion coupled to the body, the first housing portion and second housing portion forming an enclosure.

19. The module of claim 14 wherein the first operating member comprises one from a group consisting of:

a power source to provide power to the digital audio player;

a mass storage device;

a radio tuner;

a communication transceiver;

a memory interconnect socket; and a display.

20. The module of claim 19 wherein the mass storage device comprises one from a group consisting of a hard drive, a flash memory device, and a removable memory disk.

21. The module of claim 19 wherein the power source comprises a battery.

22. The module of claim 21 wherein the at least one additional operating member comprises a battery recharging circuit to restore a charge to the battery.

23. The module of claim 28 wherein the display comprises a liquid crystal display.

24. The digital audio player of claim 15 wherein the first operating member comprises one from a group consisting of:
- a power source to provide power to the digital audio player;
- a mass storage device;
- a radio tuner;
- a communication transceiver;
- a memory interconnect socket; and
- a display.

25. The digital audio player of claim 24 wherein the mass storage device comprises one from a group consisting of a hard drive, a flash memory device, and a removable memory disk.

26. The digital audio player of claim 24 wherein the power source comprises a battery.

27. The module of claim 26 wherein the at least one additional operating member comprises a battery recharging circuit to restore a charge to the battery.

28. The module of claim 24 wherein the display comprises a liquid crystal display.

29. The digital audio player of claim 16 wherein the at least one additional operating member comprises one from a group consisting of:
- a power source to provide power to the digital audio player;
- a mass storage device;
- a radio tuner;
- a communication transceiver;
- a memory interconnect socket; and
- a display.

30. The digital audio player of claim 29 wherein the mass storage device comprises one from a group consisting of a hard drive, a flash memory device, and a removable memory disk.

31. The digital audio player of claim 29 wherein the power source comprises a battery.

32. The module of claim 31 further comprising a battery recharging circuit to restore a charge to the battery.

33. The module of claim 29 wherein the display comprises a liquid crystal display.

34. The digital audio player of claim 17 wherein at least one of the plurality of interchangeable means comprises one from a group consisting of:
- a power source to provide power to the digital audio player;
- a mass storage device;
- a radio tuner;
- a communication transceiver;
- a memory interconnect socket; and
- a display.

35. The digital audio player of claim 34 wherein the mass storage device comprises one from a group consisting of a hard drive, a flash memory device, and a removable memory disk.

36. The digital audio player of claim 35 wherein the power supply comprises a battery.

37. The module of claim 36 further comprising a battery recharging circuit to restore a charge to the battery.

38. The module of claim 34 wherein the display comprises a liquid crystal display.

39. The digital audio player of claim 18 wherein the power source comprises a battery to supply power to the body and removable module.

40. The digital audio player of claim 18 wherein the player further comprises a plurality of additional removable modules configured to provide at least one alternate function.

41. The module of claim 19 wherein the at least one additional operating member comprises one from a group consisting of:
- a power source to provide power to the digital audio player;
- a mass storage device;
- a radio tuner;
- a communication transceiver;
- a memory interconnect socket; and
- a display; and
    wherein the first operating member and the at least one additional operating member perform different predetermined functions.

42. The digital audio player of claim 24 wherein the at least one additional operating member comprises one from a group consisting of;
- a power source to provide power to the digital audio player;
- a mass storage device;
- a radio tuner;
- a communication transceiver;
- a memory interconnect socket; and
- a display; and
    wherein the first operating member and the at least one additional operating member perform different predetermined functions.

* * * * *

UNITED STATES PATENT AND TRADEMARK OFFICE
CERTIFICATE OF CORRECTION

PATENT NO.     : 6,606,281 B2
DATED          : August 12, 2003
INVENTOR(S)    : Clayton N. Cowgill, John Marshall, Phil Johnson and Michael Walters It is certified that error appears in the above-identified patent and that said Letters Patent is hereby corrected as shown below:

Column 8,
Line 58, please delete "In accordance the" and substitute -- In accordance with the --

Column 9,
Line 14, please delete "provide an new" and substitute -- provide a new --
Line 17, please delete "as an mobile" and substitute -- as a mobile --
Line 47, please delete "skilled" and substitute -- skills --

Column 11,
Line 47, please delete "claim 1" and substitute -- claim 1, --

Column 12,
Line 2, please delete "forte" and substitute -- for the --
Line 3, please delete "to" and substitute -- the --
Line 13, please delete "functions" and substitute -- functions, --
Line 26, please delete "player" and substitute -- player, --
Line 66, please delete "claim 28" and substitute -- claim 19 --

Signed and Sealed this

Sixteenth Day of December, 2003

JAMES E. ROGAN
*Director of the United States Patent and Trademark Office*